United States Patent [19]

Layne et al.

[11] 4,011,016

[45] Mar. 8, 1977

[54] SEMICONDUCTOR RADIATION WAVELENGTH DETECTOR

[75] Inventors: Charles R. Layne, Orlando; M. William Ford, Maitland, both of Fla.

[73] Assignee: Martin Marietta Corporation, New York, N.Y.

[22] Filed: Sept. 23, 1975

[21] Appl. No.: 616,115

Related U.S. Application Data

[63] Continuation of Ser. No. 465,652, April 30, 1974, abandoned.

[52] U.S. Cl. .............................. 356/195; 250/211 J; 357/30
[51] Int. Cl.² ..................... G01J 3/46; H01J 39/12; H01L 27/14
[58] Field of Search ............ 357/58, 30; 250/211 J, 250/226, 214 R; 356/229, 173, 195

[56] References Cited

UNITED STATES PATENTS

| | | | |
|---|---|---|---|
| 3,304,430 | 2/1967 | Biard et al. | 250/211 J |
| 3,478,214 | 11/1969 | Dillman | 250/211 J |
| 3,484,663 | 12/1969 | Halus | 250/211 J |

*Primary Examiner*—Alfred E. Smith
*Assistant Examiner*—T. N. Grigsby
*Attorney, Agent, or Firm*—Sughrue, Rothwell, Mion, Zinn & Macpeak

[57] ABSTRACT

A double-layer photodiode is created in an integral structure to form two diodes, the upper diode having a relatively thin active region and the lower diode a relatively thick active region. Light whose wavelength is to be measured is directed onto the upper diode. The thickness of the first diode is chosen so that, in the spectrum of light wavelengths being measured, the energy of the shortest wavelength is entirely absorbed therein. As the radiation wavelength increases, the absorption by the upper diode decreases exponentially, and the unabsorbed light is transmitted through the thin active region into the thick active region of the lower diode where it is absorbed. The thickness of the active region of the lower diode is chosen so that it absorbs substantially all of the energy of longest wavelength in the spectrum being measured. The absorption of the photon energy in each diode creates electron-hole pairs therein which produce in each diode a change in conductivity which is proportional to the absorbed energy. Therefore, since the difference in conductivities of the two diodes is a function of the wavelength of the incident light, as the wavelength changes, the difference between changes in the conductivity of the two diodes, divided by the sum of the changes in conductivity, is a function which is a single-valued function of the wavelength of the incident light and which is independent of the intensity of the incident light. A measuring circuit connected to the double-layer diode provides a direct reading of the wavelength. Furthermore, there is disclosed a method for fabricating a double-layer photodiode suitable for use in the wavelength detector.

10 Claims, 7 Drawing Figures

SEMICONDUCTOR RADIATION WAVELENGTH DETECTOR

This is a continuation of application Ser. No. 465,652, filed Apr. 30, 1974, now abandoned.

BACKGROUND OF THE INVENTION

1. Field of the Invention

This invention relates to the field of optoelectronic devices and, more specifically, to light-sensitive semiconductor devices for detecting the wavelength of incident electromagnetic radiation.

2. Description of the Prior Art

In the past, many semiconductor devices, such as the photodiode, have been developed which are readily excited by photons to vary the electrical conductivity thereof. Thus, when the photons of electromagnetic radiation in the visible or infrared spectrum are absorbed by an appropriate semiconductor, a change of conductivity results due to the holes and electrons created by the absorbed photon energy. Such semiconductor devices have been operated in a photovoltaic mode wherein no external electrical bias is provided, and wherein a change in voltage across the device results from the creation of excess electron-hole pairs due to the absorption of photons. Radiation-sensitive semiconductor devices can also be operated in a photoconductive mode wherein a reverse bias is applied across a junction of the semiconductor device in order to create a depletion layer in which carriers are generated by the photons absorbed from incident radiaton. When a reverse bias is applied, the response time of the semiconductor device is decreased since the electric field generated by the reverse bias decreases the transit time of the carriers conducted through the semiconductor to the respective terminals thereof.

It is also well known that the light absorption of a semiconductor light detector is a function of the thickness and absorption coefficient of the semiconductor and of the wavelength of the incident light. An example of a device utilizing this principle is disclosed in U.S. Pat. No. 3,452,204 wherein the thickness of a reverse-biased photodiode is appropriately established so that only incident radiation of a relatively narrow bandpass is detected. While such a device is responsive to a selected narrow frequency band, this reference does not disclose a method or apparatus for measuring the frequency or wavelength of incident radiation.

With the increased utilization of radiation-controlled devices such as lasers, there has resulted an increasing need for a simple, but accurate, means for detecting the wavelength of incident radiation. Wavelength measuring devices in the past have employed multiple light filters and detectors which are either exceedingly complex or lack the sensitivity required for many applications.

SUMMARY OF THE INVENTION

Therefore, the primary object of this invention is to provide an improved method and apparatus for detecting the wavelength of electromagnetic radiation.

Another object of this invention is to provide a novel dual-layer semiconductor wavelength detector capable of producing a direct readout of the wavelength of monochromatic electromagnetic radiation impinging thereon.

Still another object is to provide a dual-layer semiconductor detector of unitary construction and which can provide wavelength identification of the type normally associated with multielement devices equipped with filters and requiring parallel electronic channels.

Another object is to provide a novel detector for ascertaining the wavelength of incident radiation independent of the radiation intensity and without the complex filters required by the prior art.

A more specific object of the invention is to provide a dual-layer semiconductor diode structure forming a thin first diode and a much thicker second diode, so that shorter wavelength energy is primarily absorbed in the first diode and longer wavelength energy is primarily absorbed in the second diode, whereby the difference in the conductivity changes occurring in the two diodes, when normalized by the total conductivity change, yields a single-valued output which is a function of the incident radiation wavelength but is independent of the intensity of the incident radiation.

A further object of the invention is to provide a novel process for fabricating a detector sensitive to a wide-range of optical frequencies, the process including multiple planar diffusion steps for physically overlapping one semiconductor diode on another, with the result being that the overlying diode both selectively detects incident radiation wavelength and also acts as an optical filler for the underlying diode.

One aspect of the invention may be briefly summarized as follows. A semiconductor radiation wavelength detector is produced by forming a pair of diodes in an integral semiconductor structure. The diode upon which incident light is directed has a thickness which is selected so that, in the range of wavelengths being measured, the energy of the shortest wavelength is substantially entirely absorbed therein. The other diode which is contiguous to the first diode has a thickness which is selected so that the longest wavelength in the range of wavelengths being detected is substantially absorbed therein. Thus, as the wavelength of the incident radiation increases the proportion of the photon energy absorbed in the first diode exponentially decreases while the photon energy absorbed in the second diode correspondingly increases. The change in conductivity of each diode due to the creation of electron-hole pairs by the absorbed photons is detected, and the difference in the changes of conductivity of the two diodes is determined relative to the sum of the changes in conductivity of both diodes to provide an output which is a single-valued function of the incident radiation wavelength.

BRIEF DESCRIPTION OF THE DRAWING

Other objects, features and advantages of the present invention will be more fully apparent from the following detailed description, appended claims and the accompanying drawing.

DETAILED DESCRIPTION OF THE PREFERRED EMBODIMENTS

Figure 3:
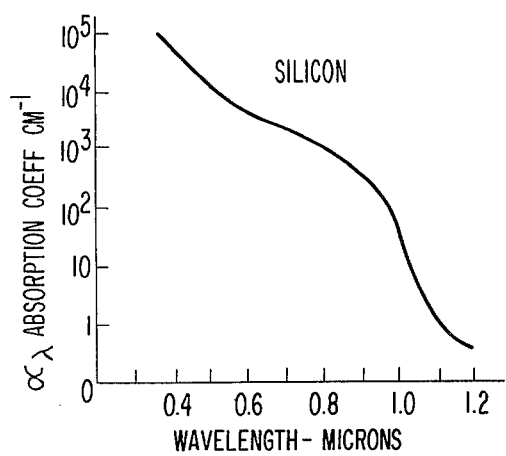
FIG. 3 is a graph showing the absorption coefficient of silicon as a function of wavelength.

Light falling upon a semiconductor material, such as a wafer of silicon, is absorbed to a degree which depends upon both the wavelength of the incident radiation and upon the thickness of the silicon wafer. Thus, for a given wavelength, the photon energy in the wafer varies exponentially with the thickness of the wafer, i.e., as the thickness of the wafer increases, the proportion of incident light energy absorbed increases. The law governing the absorption has the form EXP $(-\alpha d)$, where $\alpha$ is the absorption and $d$ is the thickness. In addition, the level of energy absorption in semiconductor materials varies as an inverse function of the radiation wavelength. Thus, for a given thickness of the silicon wafer, the amount of light absorbed decreases exponentially as the wavelength of the light increases. A graph of the absorption coefficient of silicon as a function of wavelength is illustrated in FIG. 3.

Figure 4:
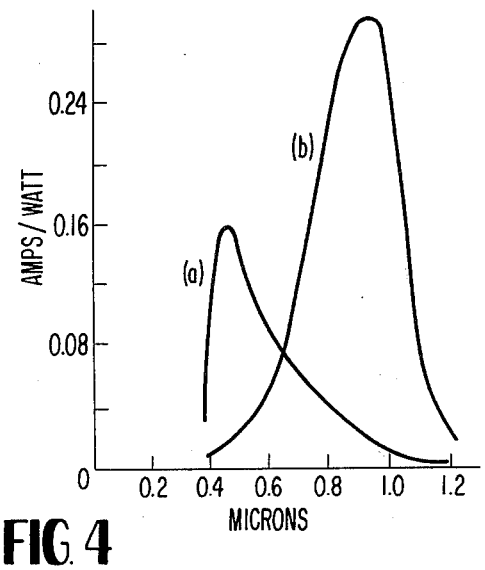
FIG. 4 is a graph showing the response of each diode as a function of incident radiation wavelength with these curves revealing the region in which our device is operative.

If a very thin layer of, for example, silicon, is placed on top of a relatively thick layer of the same material and the top thin layer is exposed to incident radiation, the amount of unabsorbed photon energy transmitted through the thin region to the thick region will increase as the wavelength increases. Thus, if light having a wavelength of 1.1 microns, which is the longest wavelength capable of creating an electron-hole pair in silicon, is directed onto the thin active region, substantially all the photon energy will be transmitted through the thin layer and absorbed in the thicker layer. On the other hand, light having a wavelength of, for example, 0.4 microns, will be substantially entirely absorbed in the thin region. The amount of light energy absorbed by the thin region decreases exponentially as the radiation wavelength increases, and, therefore, the unabsorbed light energy is transmitted through the thin region into the thick region, where it is absorbed. In other words, the thin region acts as a wavelength - dependent optical filter for the thick region. Consequently, the amount of light energy absorbed by the thick region increases with increasing wavelength as a result of the increasing transparency of the upper diode. Even though the absorption of the thick region also decreases exponentially with increasing wavelength, the thickness is chosen to be great enough such that the total absorption of light in the thick region decreases much more slowly than in the thick region, whereby substantially all of the energy at the maximum wavelength, e.g., 1.1 microns, is absorbed in the thick region. The resulting changes in conductivity of the two regions are illustrated in FIG. 4 which is discussed in more detail below. Provided the two regions are appropriately isolated from one another electrically, the changes in conductivity of each region can be detected to thereby determine the quantity of light energy absorbed in each region. By normalizing the detected changes in conductivity, an output can be provided which is a single-valued function of wavelength and is independent of light intensity.

Figure 1:
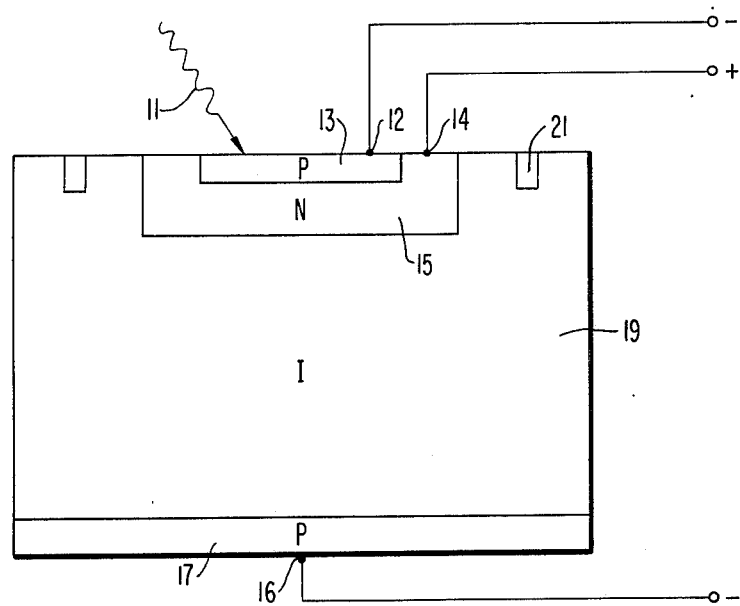
FIG. 1 is a schematic diagram of the semiconductor radiation wavelength detector of the present invention, and shows the dual-layer diode structure thereof.

Refer now to FIG. 1 which is a schematic diagram of a preferred embodiment of the semiconductor radiation wavelength detector of the present invention. A high resistivity wafer of silicon is illustrated, although it should be understood that any other suitable semiconductor material may be utilized depending upon the spectral range being measured. The semiconductor is comprised of two diodes each having a P and an N region formed in an integral structure. The top diode, upon which the incident radiaton 11 is directed, includes a P region 13 and an N region 15.

In the photovoltaic mode of the invention, the incident light causes carriers to be generated in the intrinsic region 19, which carriers induce between N region 15 and P region 17 an electric field which is manifested by a potential difference between contacts 14 and 16. The incident light also causes carriers to be generated at the interface of P region 13 and N region 15, thereby creating an electric field and a corresponding potential difference between contacts 12 and 14.

In the photoconductive mode, the incident light generates carriers in intrinsic region 19, as before, and those carriers induce in region 19 a conductivity change which is manifested as a flow of current between contacts 14 and 16. The light also generates carriers at the interface of region 13 and 15, thus creating a flow of current between contacts 12 and 14. In this mode, the speed of response of the detector is increased, thereby providing an adequate response to very short pulses of incident light, such as from a laser. The top diode is reverse-biased by applying to the ohmic contact 12 of the P region a potential which is negative with respect to the potential applied to the ohmic contact 14 of the N region. The lower diode includes N region 15, which is shared with the top diode, and a P region 17 which is separated from the N region by the intrinsic layer 19, thereby forming what is commonly known as a PIN diode. The second diode is reverse-biased by applying to the ohmic contact 16 a potential which is negative with respect to the potential of the N region 15. The radiation is directed such that it falls upon only region 13 and not on any other regions of the diode. In the preferred embodiment, the radiation source is a laser whose light output is collected and focused by conventional optics onto the P region 13.

When the negative bias is applied to the upper P region 13, free carriers at the junction between the upper P region and the N region 15 are swept out, leaving a very thin, fully depleted active region in the upper diode. The thickness of the active region is determined by the bias voltage across the junction. When a reverse bias is applied to the lower P region 17, free carriers are swept out of the intrinsic layer 19, and the depleted region thus formed defines the second active region. Since the thickness of the active region of the lower diode is also dependent upon the bias voltage applied thereto, this bias voltage will be substantially larger than the voltage applied to the first diode. By this biasing technique two active regions, one thin and the other relatively thick, are formed, which regions are electrically isolated but physically connected to one another.

The thickness of the first diode is chosen so that the energy of the shortest wavelength in the range of wavelengths being measured is substantially completely absorbed therein, while the energy of longest wavelength is substantially completely transmitted to be absorbed in the thicker lower diode. As an example, using diodes formed from silicon wafers and measuring the wavelength of radiation over a range of 0.4 to 1.1 microns, the upper diode has a total thickness of between 7 and 12 microns. The lower PIN diode has a minimum thickness which must be greater than 300 microns in order to absorb a high percentage of the photon energy of the longer wavelengths. The maximum thickness of the lower diode is limited only by the increased transit time required for the carriers to reach the ohmic contact 16. Thus, the maximum thickness of the lower diode is dependent upon the frequency response desired. In the preferred embodiment utilizing a silicon wafer, a thickness of 400 microns was found to provide an optimum absorption level and frequency response. We select the thickness of the diodes so as to provide responses throughout the wavelength region of operation, such that the relationship between the two responses is a monotonic function of wavelength.

Photon energy over a wavelength range or spectrum of 0.4 to 1.1 microns is absorbed in varying amounts in the two diodes. The shorter wavelengths are predominantly absorbed in the thin upper diode while the longer wavelengths are absorbed in the thicker PIN diode. In both diodes the absorbed photons create electron-hole pairs, one electron-hole pair for each photon absorbed. The electrons move toward the positively charged N region 15 and the holes move toward the respective negatively charged P regions 13 and 17. As electron-hole pairs are being created in each diode, the conductivity of each diode is increased. However, because each diode is electrically isolated from the other, the change in conductivity of one diode does not modulate or change the conductivity of the other diode.

Figure 2:
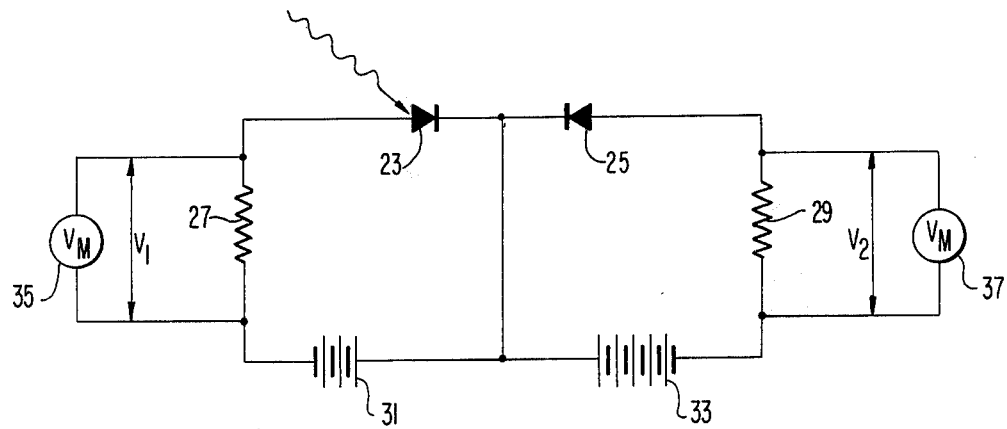
FIG. 2 is a schematic diagram of a measuring circuit utilizing the semiconductor wavelength detector of FIG. 1, and from which circuit the wavelength of incident radiation can be determined.

Referring to FIG. 2, there is disclosed a circuit for determining the wavelength of the radiation incident on the dual diode arrangement of FIG. 1. The upper diode, including N region 15 and P region 13, is schematically illustrated by the diode 23, while the lower PIN diode is represented schematically by the diode 25. Each diode is appropriately reverse-biased so that a relatively thin active region is formed in diode 23 and a relatively thick active region is formed in diode 25. Exemplary bias volrtages are 6 volts for diode 23 and 100 to 150 volts for diode 25, provided by batteries 31 and 33 respectively.

When incident radiation is directed onto the surface of diode 23 so that the radiation impinges only upon the P region 13 while being blocked from other regions, the changes in conductivity of the diodes 23 and 25 are detected by using voltmeters 35 and 37 to measure the change in voltages V1 and V2 across the load resistors 27 and 29, respectively. FIG. 4 illustrates the conductivity of each diode as a function of incident radiation wavelength in the form of a graph of load current vs. wavelength. Curve $a$ is the current through resistor 27 and represents the conductivity of diode 23, while curve $b$ is the current through resistor 29 and represents the conductivity of diode 25. The radiation wavelength is in the range of 0.4 to 1.1 microns. Since the difference in conductivity for each diode is a function of the wavelength of the incident radiation, an output which is a single-valued function of the wavelength of the incident radiation can be determined by dividing the difference of the voltage changes across the resistors by the sum of the voltage changes in accordance with the following equaton:

$$\lambda = K \frac{\Delta V_1 - \Delta V_2}{\Delta V_1 + \Delta V_2}$$

where $\lambda$ is the detected wavelength, $K$ is a constant which is determined by appropriately calibrating the system in accordance with known techniques, $\Delta V_1$ is the change in voltage across resistor 27 and $\Delta V_2$ is the change in voltage across resistor 29.

Figure 5:
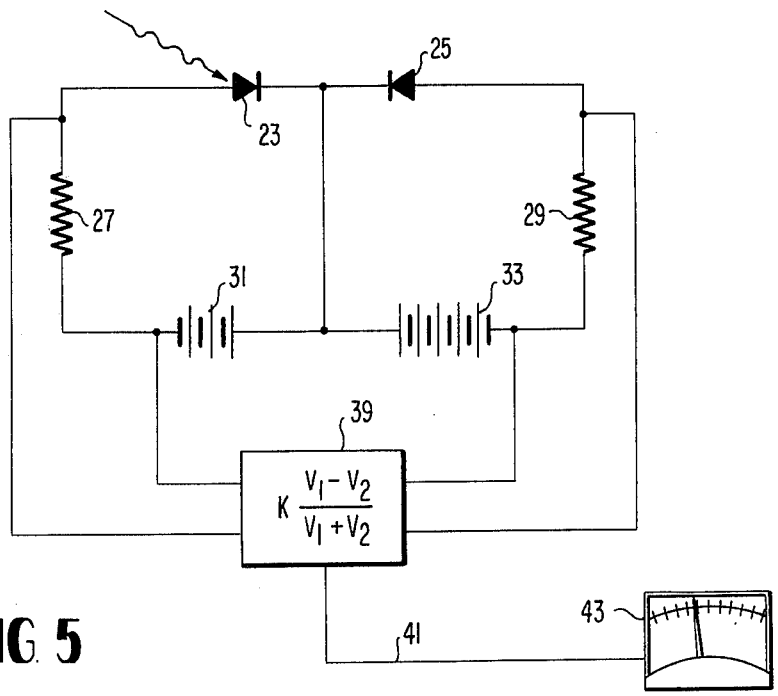
FIG. 5 is a schematic diagram of another circuit for measuring the wavelength and also providing a direct readout of the wavelength.

FIG. 5 illustrates an alternative circuit for directly measuring the wavelength of the incident radiation. Here, V1 and V2 are applied to a conventional analog calculating circuit 39 which provides an output line 41 a voltage equal to $K(V1 - V2)/(V1 + V2)$. This voltage is applied to a voltmeter 43 which is calibrated to read wavelength $\lambda$ directly. Again, the batteries 31 and 33 for providing the required reverse biases may typically be 6 volt and 100-150 batteries, respectively.

Since the detector's output is dependent only upon the relative energy absorbed in each diode, it can be seen that the detector provides an output which is substantially independent of the intensity of the incident radiation. Thus, the power level of the incident radiation can vary with time while not affecting the accuracy of the output of the detector.

Figure 7:
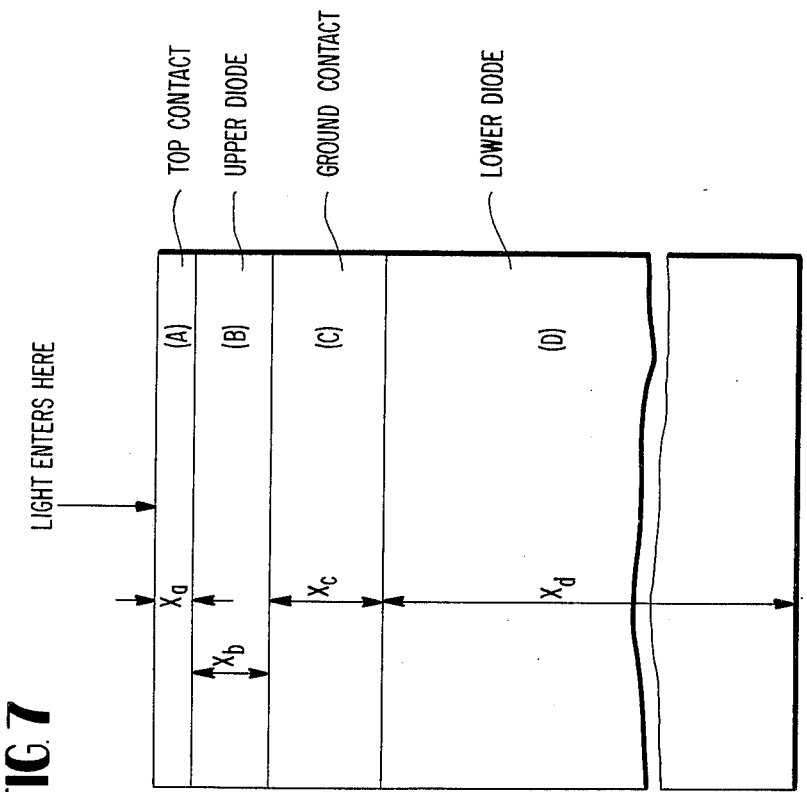
FIG. 7 is a schematic diagram of the structure of the detector and is useful in the theoretical analysis of the optical response thereof.

The detailed structure of the dual-layered detector is shown in FIG. 7. Theoretical analysis of the optical response characteristics requires consideration of the four elements shown. The two contact regions A and C are essentially inert absorbers. The diode regimes, B and D, are the active regions where absorbed photons generate carriers which can be processed in an external circuit.

The following is obtained from an analysis of the device. The amount of light energy transmitted through the top contact region is:

$$A = EXP(-\alpha_\lambda X_a) \tag{1}$$

The amount absorbed in the top active region:

$$B = 1 - EXP(-\alpha_\lambda X_b) \tag{2}$$

The amount transmitted through the buried contact region:

$$C = EXP(-\alpha_\lambda X_c) \tag{3}$$

The amount absorbed in the lower active region:

$$D = 1 - EXP(-\alpha_\lambda X_d) \tag{4}$$

where $\alpha \lambda$ is the absorption coefficient of silicon at wavelength $\lambda$.

The signal developed in the top diode is then:

$$B' = K\, EXP(-\alpha_\lambda X_a)\, [1 - EXP(-\alpha_\lambda X_b)] \tag{5}$$

where: $K$ = a function of input flux intensity.

The signal developed in the lower diode is:

$$D' = K[EXP(-\alpha_\lambda \{X_a + X_b + X_c\})]\, [1 - EXP(-\alpha_\lambda X_d)] \tag{6}$$

The normalized ratio response, $$Z = (B' - D')/(B' + D') \tag{7}$$

Figure 6:
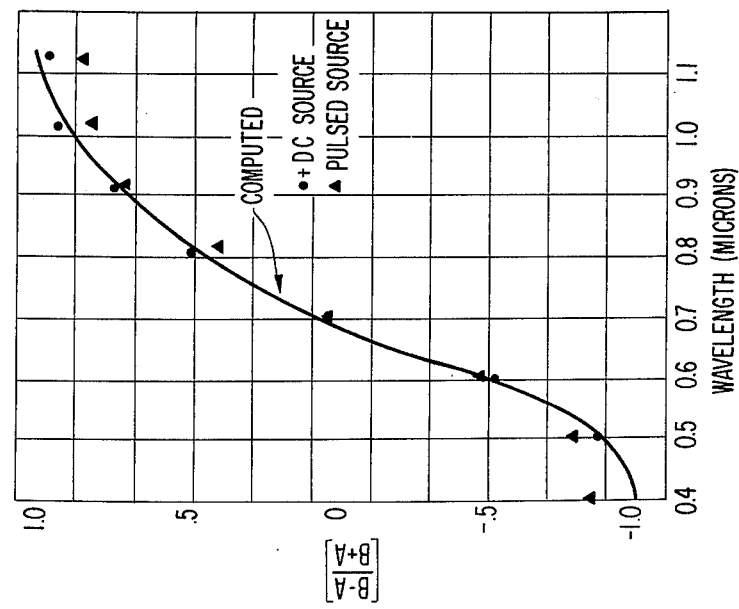
FIG. 6 is a graph of the normalized output of the detector as a function of wavelength, and shows both computed and measured values.

Substituting for B' and D' and neglecting the effects of the top contact and buried contacts:
where $$\epsilon X_i = X_a + X_b + X_c \qquad (8)$$

or, $$Z = 1 - 2EXP(-\alpha_\lambda X_b) \qquad (9)$$

which is a good approximation of the measured data for D.C. and pulsed light sources as shown in FIG. 6 which also shows a computed curve.

A preferred method of fabricating the dual-layer diode detector of FIG. 1 will now be described. A high resistivity silicon wafer (5000–20,000 Ω cm, p-type conductivity) is sliced and polished. Standard polishing techniques are used to minimize work damage to the polished surface. The bulk lifetime of the silicon should be >500 µsec and ~1 millisec preferred.

The wafers to be diffused are cleaned with organic solvents and rinsed in high purity water (>15 megohm resistivity). The wafers are dried in hot nitrogen gas. The wafers are then oxidized by heating in a wet gas ($N_2$) or dry $O_2$ atmosphere at approximately 1000° C. An oxide thickness of 5000–7000 angstroms is desired.

The wafer is then coated with photolithograhic resist solution. Glass photographic plates are used to provide a pattern, which when exposed to ultra violet light, will make the photoresist soluble in selected areas. The remaining resist will permit the oxide to be removed by etching in dilute hydroflouric acid only in the desired areas. The N-type region 15 will be formed in these areas. The guard ring 21 is diffused to minimize the reverse bias leakage current. The N-type diffusion is carried out as follows: Phosphorus oxychloride ($POCl_2$) is used as the surce of N-type carriers. Nitrogen gas is bubbled at a rate of approximately 200cc/min. through the $POCl_2$ liquid whose temperature is accurately controlled near 0° C to maintain a constant saturation in the gas. The saturated gas flows over the wafers which are heated to approximately 900° C. A surface concentration of approximately $5 \times 10^{16}$ atms/cc and a depth of 3 microns are required to obtain the desired optical response. During the diffusion, an oxidation occurs which forms a new oxide layer.

In a similar manner, P+ layers are simultaneously diffused into the N layer 15 and the opposite surface of the wafer to create the P region 13 and 17. A photolithographic operation as described previously is used to define the diffusion area in the N region: Boron trichloride $BCl_3$) liquid is used to saturate $N_2$ gas with P-type carriers. The gas flows over the wafers heated to approximately 900° C and diffuses a P+ layer from 0.3–0.5 microns in depth. The surface concentration should be as high as possible (>$10^{19}$ atms/cc). During this operation a reoxidation takes place.

By the photolithograhic process, holes are cut through the oxide for contact to each of the three layers. A chrome-gold double evapoaration process is used to provide the metalized contacts to each layer. The chip is scribed and broken in the usual manner and chips are mounted to the package using gold eutectic solder. Gold ball-bond leads are used to make connections between the chip and the package leads. Four leads are required.

The package is sealed in a dry nitrogen atmosphere by welding a glass windowed cap onto the package header. A hermetic seal test is made to insure an insert environment for long term reliability.

Even though the above planar diffusion processed is preferred, other techniques such as ion implementation or mesa diffusion can be used advantageously in certain situations. Furthermore, other manufacturing processes, such as Shottky barrier techniques, could be used to create the back contact and the upper P contact or P diffusion.

While the present invention has been disclosed in connection with a preferred embodiment thereof, it should be understood that other semiconductor materials, and various sizes and shapes thereof may be utilized in keeping with the spirit and scope of the invention as defined by the appended claims.

We claim:

1. A semiconductor wavelength detector for determining the wavelength of incident monochromatic electromagnetic radiation whose wavelength is variable within a specified range comprising:
   a first semiconductor photodiode having an active region with a thickness and absorption coefficient such that it absorbs substantially all the photon energy of the shortest wavelength in said range, but which transmits an increasing amount of photon energy as the wavelength increases until substantially all of the longest wavelength in said range is transmitted;
   a second semiconductor photodiode monolithically formed with said first diode and having an active region which is thicker than that of said first photodiode and which absorbs substantially all of the photon energy transmitted by said first diode, the proportion of photon energy absorbed by said first and second diodes varying in accordance with the wavelength of the incident radiation throughout said specified range; said incident radiation being directed only onto said first diode, and said diodes being formed in the same semiconductor material; and
   means for continuously measuring the wavelength of the incident radiation throughout said specified range by comparing the changes in photoconductivity of both said photodiodes as the wavelength varies.

2. The wavelength detector of claim 1 wherein said second diode is a PIN diode.

3. The wavelength detector of claim 2 wherein said first and second diodes share a commonly doped region.

4. The wavelength detector of claim 1 further comprising means for reverse-biasing said first and second diodes, said biasing means establishing the thinner active region in said first diode, the thicker active region in said second diode and electrical isolation of said first diode from said second diode.

5. The wavelength detector or claim 4 further comprising:
   a load resistor connected in series with each diode; and
   means for measuring the change in current flowing through each resistor as a measure of the corresponding change in photoconductivity of each diode.

6. The wavelength detector of claim 5 wherein said measuring means comprises a voltmeter connected across each load resistor.

7. The wavelength detector of claim 5 wherein said measuring means comprises calculator means connected across both load resistors for producing a normalized signal proportional to the difference in voltage changes across the resistors divided by the sum of the voltage changes, and indicator means responsive to the normalized signal for producing a direct readout of the wavelength of the incident radiation.

8. A method of determining the wavelength of monochromatic radiation whose wavelength is variable within a specified range comprising the steps of:

directing the radiation upon a first semiconductor photodiode having an active region with a thickness and absorption coefficient such that it absorbs substantially all the radiation energy at the shortest wavelength of the specified range, but which transmits increasing amounts of radiation energy as the wavelength thereof increases, until substantially all of the radiation energy at the longest wavelength in said range is transmitted; monolithically forming in the same semiconductor material a second photodiode contiguous to said first diode and having a thicker active region than that of said first diode and which absorbs substantially all of the radiation energy transmitted by said first diode, the proportion of radiation energy absorbed by the diodes varying in accordance with the wavelength of the radiation throughout said specified range; and continuously measuring the wavelength of the incident radiation throughout said specified range by comparing the changes in photoconductivity of both said photodiodes as the wavelength varies.

9. The method of claim 8 further comprising computing the quotient of the difference in changes in conductivity of both diodes divided by the sum of the changes as a measure of the normalized wavelength of the radiation.

10. A monolithic semiconductor wavelength detector for determining the wavelength of incident monochromatic electromagnetic radiation within a continuous specified range of wavelengths and comprising first and second semiconductor photodiodes operatively disposed in adjacent relationship in the same semiconductor material, means for limiting the entry of incident electromagnetic radiation to entry through said first photodiode, said first photodiode having an active region which absorbs substantially all of the photon energy of the shortest wavelength within said continuous specified wavelength range, and said second photodiode having a thicker active region than that of said first diode and which absorbs substantially all of the photon energy that passes through said first photodiode, the proportion of photon energy absorbed by said first and second diodes varying in accordance with the wavelength of the incident radiation throughout said continuous specified range, and means connected to said first and second photodiodes for measuring the wavelength of the incident radiation throughout said continuous specified range.

* * * * *